US011340060B2

(12) United States Patent
Li et al.

(10) Patent No.: US 11,340,060 B2
(45) Date of Patent: May 24, 2022

(54) AUTOMATIC RECIPE OPTIMIZATION FOR OVERLAY METROLOGY SYSTEM

(71) Applicant: KLA Corporation, Milpitas, CA (US)

(72) Inventors: Weihua Li, Shanghai (CN); Shiming Wei, Shanghai (CN)

(73) Assignee: KLA Corporation, Milpitas, CA (US)

( * ) Notice: Subject to any disclaimer, the term of this patent is extended or adjusted under 35 U.S.C. 154(b) by 131 days.

(21) Appl. No.: 16/919,378

(22) Filed: Jul. 2, 2020

(65) Prior Publication Data

US 2021/0025695 A1 Jan. 28, 2021

Related U.S. Application Data

(60) Provisional application No. 62/877,397, filed on Jul. 23, 2019.

(51) Int. Cl.
*G01B 11/24* (2006.01)
*G06N 3/04* (2006.01)

(52) U.S. Cl.
CPC ............. *G01B 11/24* (2013.01); *G06N 3/04* (2013.01)

(58) Field of Classification Search
CPC ..... G01B 11/24; G03F 7/705; G03F 7/70633; G06F 12/0811; G06F 12/0842; G06F 12/0859; G06F 12/0862; G06F 12/0897; G06F 13/1684; G06F 16/901; G06F 2212/1024; G06F 2212/6026; G06F 12/023; G06F 12/0868; G06F 13/1652; G06F 13/1673; G06F 2212/1016; G06F 2212/283; G06F 2212/452; G06F 2212/7201; G06N 3/04; G06N 20/10; G06N 3/08; G06N 5/003; H01R 13/04; H01R 13/11; H01R 13/111; H01R 13/17; H01R 13/187; H01R 13/193; H01R 13/20; H01R 13/2464
USPC .................................................. 356/511–515
See application file for complete search history.

(56) References Cited

U.S. PATENT DOCUMENTS

| 7,171,284 B2 | 1/2007 | Vuong et al. |
| 7,525,673 B2 | 4/2009 | Vuong et al. |
| 7,742,889 B2 | 6/2010 | Tian et al. |
| 7,761,178 B2 | 7/2010 | Tian et al. |
| 9,607,265 B2 | 3/2017 | Jin et al. |

(Continued)

FOREIGN PATENT DOCUMENTS

| WO | 2016096309 A1 | 6/2016 |
| WO | 2017123553 A1 | 7/2017 |

OTHER PUBLICATIONS

PCT International Search Report and Written Opinion for International Application No. PCT/US2020/042699 dated Oct. 30, 2020, 9 pages.

(Continued)

*Primary Examiner* — Tri T Ton
(74) *Attorney, Agent, or Firm* — Suiter Swantz pc llo

(57) ABSTRACT

An overlay metrology system is disclosed. The overlay metrology system includes a controller configured to be communicatively coupled with an overlay metrology subsystem. The controller receives overlay measurements from the overlay metrology subsystem and generates one or more quality metrics. The controller extracts a set of principle components from the one or more quality metrics. The controller generates input data and inputs the input data into an input matrix of a supervised machine learning algorithm to train a predictive model. The controller then identifies a recipe or hardware configuration with a minimum residual value.

27 Claims, 8 Drawing Sheets

(56) References Cited

U.S. PATENT DOCUMENTS

| | | | |
|---|---|---|---|
| 2006/0064280 | A1 | 3/2006 | Vuong et al. |
| 2009/0063076 | A1 | 3/2009 | Liu et al. |
| 2013/0110477 | A1 | 5/2013 | Pandev |
| 2013/0262044 | A1 | 10/2013 | Pandev et al. |
| 2015/0176985 | A1 | 6/2015 | Shchegrov et al. |
| 2015/0323316 | A1 | 11/2015 | Shchegrov et al. |
| 2017/0109646 | A1 | 4/2017 | David |
| 2017/0200260 | A1 | 7/2017 | Bhaskar et al. |

OTHER PUBLICATIONS

Asthana, Stuti et al., "Analysis of Multiple Hidden Layer vs. Accuracy in Performance using Back Propagation Neural Network", Indian Journal of Science and Technology, vol. 10(4), Jan. 2017, www.indjst.org, pp. 1-4.

Bhattacharyya, Kaustuve et al., "Multi-wavelength apprach towards on-product overlay acuracy and robustness", SPIE Advanced Lithography, 2018, San Jose, California, Proceedings of SPIE, vol. 10585, 9 pages.

Breiman, Leo, "Arcing the Edge", Technical Report 486, Statistics Department University of California, Berkeley, CA, Jun. 1997, 14 pages.

Bringoltz, Barak et al., "Acuracy In Optical Overlay Metrology", Semiconductor Engineering, Jan. 18, 2017, https://semiengineering.com/accuracy-in-optical-overlay-metrology/, 53 pages.

Kambhatla, Nandakishore et al., "Dimension Reduction by Local Principal Component Analysis", Neural Computation, 9, pp. 1493-1516, 1997.

Kim, Dongil et al., "Machine learning-based novelty detection for faulty wafer detection in semiconductor manufacturing", Expert Systems with Applications, vol. 39, Issue 4, Mar. 2012, Abstract, pp. 4075-4083.

Tjong Kim Sang, Erik F. et al., "Introduction to the CoNLL-2003 Shared Task: Language-Independent Named Entity Recognition", Proceedings of the Seventh Conference on Natural Language Learning at HLT-NAACL 2003, vol. 4, Association for Computational Linguistics, 2003, 6 pages.

Tzai, Wei Jhe et al., "Techniques for improving overlay accuracy by using device correlated metrology targets as reference", Journal of Micro/Nanolithography, MEMS, and MOEMS, vol. 13(4), Oct.-Dec. 2014, 7 pages.

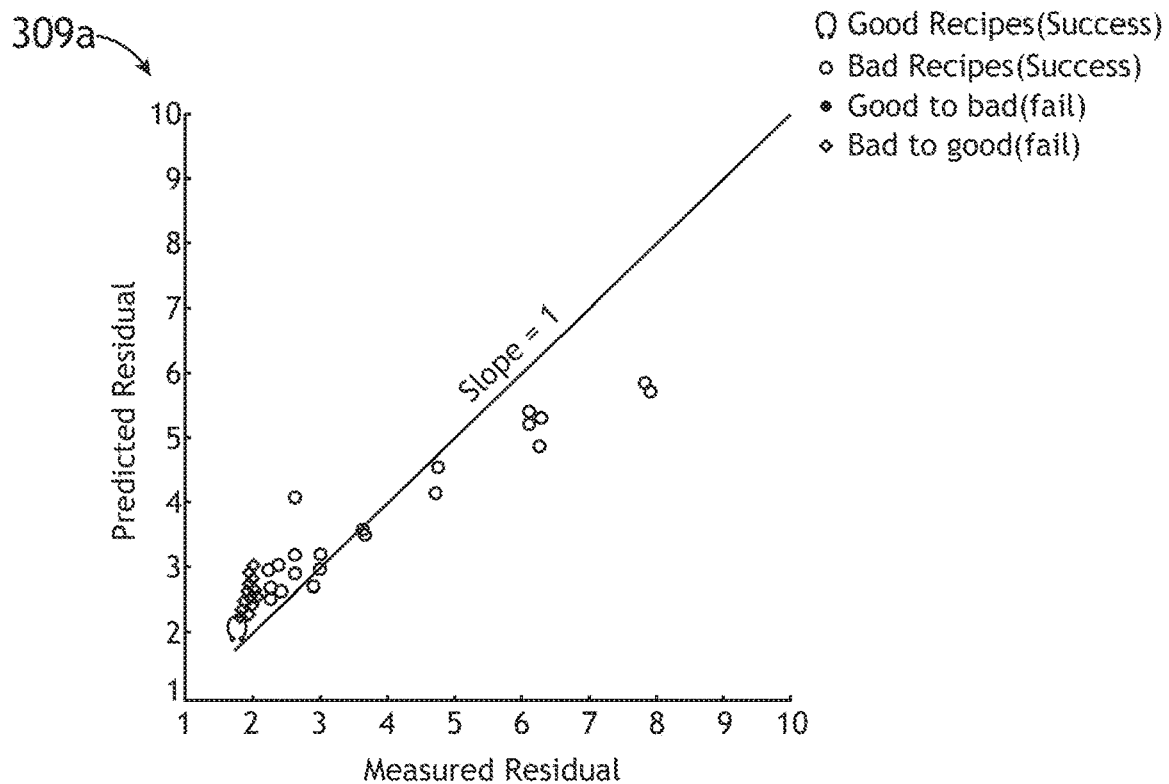
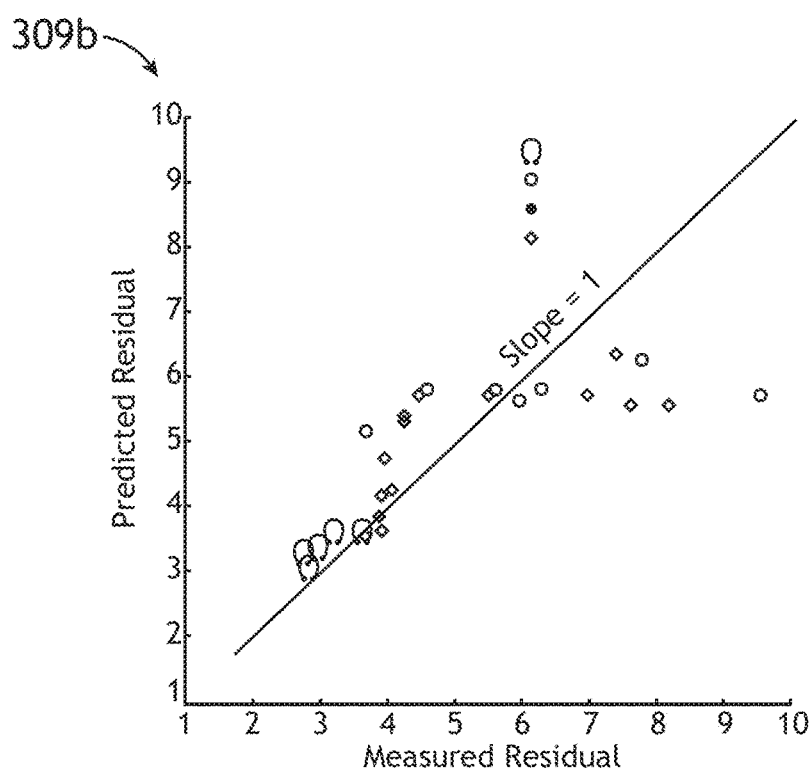
FIG.3B

| Layer # | Layer Information | # of HWs | Single Learner ||||||| Combined Learner |||
|---|---|---|---|---|---|---|---|---|---|---|---|
| | | | Linear Regression | Neural Network | Gaussian Process | SVM-R | Decision Tree | Boosting Tree | Linear Fitting | Averaging | 0.9*NN+ 0.1*DT |
| 1 | Layer #1 | 84 | 4 | 8 | 7 | 7 | 6 | 6 | 8 | 7 | 8 |
| 2 | Layer #2 | 84 | 1 | 6 | 1 | 1 | 1 | 3 | 0 | 2 | 2 |
| 3 | Layer #3 | 84 | 0 | 3 | 1 | 2 | 3 | 3 | 4 | 2 | 1 |
| 4 | Layer #4 | 84 | 3 | 2 | 6 | 7 | 3 | 2 | 3 | 5 | 5 |
| 5 | Layer #5 | 84 | 5 | 4 | 2 | 2 | 5 | 1 | 2 | 2 | 4 |
| 6 | Layer #6 | 84 | 7 | 9 | 8 | 8 | 5 | 6 | 6 | 9 | 8 |
| 7 | Layer #7 | 84 | 8 | 8 | 7 | 7 | 8 | 8 | 7 | 8 | 8 |
| 8 | Layer #8 | 84 | 5 | 5 | 4 | 2 | 5 | 3 | 3 | 4 | 5 |
| 9 | Layer #9 | 84 | 0 | 2 | 0 | 0 | 7 | 0 | 0 | 0 | 1 |
| 10 | Layer #10 | 84 | 2 | 2 | 2 | 3 | 3 | 2 | 2 | 2 | 2 |
| 11 | Layer #11 | 84 | 9 | 6 | 6 | 6 | 2 | 4 | 6 | 6 | 6 |
| 12 | Layer #12 | 84 | 2 | 6 | 7 | 6 | 0 | 6 | 6 | 6 | 5 |
| 13 | Layer #13 | 84 | 0 | 3 | 0 | 0 | 4 | 4 | 2 | 3 | 4 |
| 14 | Layer #14 | 84 | 0 | 5 | 5 | 5 | 6 | 4 | 5 | 6 | 5 |
| 15 | Layer #15 | 84 | 0 | 0 | 0 | 0 | 5 | 0 | 0 | 0 | 0 |
| 16 | Layer #16 | 84 | 5 | 6 | 2 | 1 | 10 | 3 | 4 | 4 | 2 |
| % of recipes that are correctly predicted | | | 0.32 | 0.47 | 0.36 | 0.36 | 0.46 | 0.34 | 0.36 | 0.41 | 0.41 |
| Average by layer success rate=3 | | | 0.60 | 0.88 | 0.67 | 0.67 | 0.88 | 0.79 | 0.75 | 0.79 | 0.79 |
| Average by layer success rate=5 | | | 0.53 | 0.68 | 0.59 | 0.58 | 0.66 | 0.61 | 0.63 | 0.68 | 0.68 |

FIG. 4

AUTOMATIC RECIPE OPTIMIZATION FOR OVERLAY METROLOGY SYSTEM

CROSS-REFERENCE TO RELATED APPLICATION

The present application claims the benefit under 35 U.S.C. § 119(e) of U.S. Provisional Application Ser. No. 62/877,397 filed Jul. 23, 2019, entitled ARCHER AUTOMATIC RECIPE OPTIMIZATION WITH MACHINE LEARNING APPROACH, naming Weihua Li and Shiming Wei as inventors, which is incorporated herein by reference in the entirety.

TECHNICAL FIELD

The present disclosure generally relates to semiconductor wafer and mask metrology. In particular, the present disclosure relates to optimizing the recipe or hardware configuration for an overlay metrology system to collect accurate and precise metrology data.

BACKGROUND

Overlay metrology systems are designed to provide accurate feedback of on-product overlay error for inline monitoring and wafer disposition at leading edge design nodes. Examples of conventional overlay metrology systems include the KLA-Tencor Archer™ series of metrology systems. For both enhanced imaging-based and scatterometry-based measurement applications, previous systems are designed to provide robust overlay measurements and control in the presence of process variation in high-volume manufacturing. The recent addition of tunable laser technology with a 1 nm resolution further improves the overlay accuracy and the correlation between imaging/scatterometry overlay targets and device overlay errors for both memory and logic layers.

Conventional automatic recipe automation (ARO) schemes for selecting optimal measurement wavelengths in imaging-based overlay metrology systems (e.g., KLA-Tencor Archer™ series overlay metrology systems) include the brute force (BF) scheme and the metrics of all badness (MOAB) scheme.

Since residual is the most commonly used accuracy indicator (e.g., the difference between a measured overlay and an actual overlay), the BF-ARO scheme entails operating an overlay metrology subsystem with various recipes (e.g., hardware configurations) and collecting a residual value for each recipe. Each recipe includes a specific combination of wavelength, polarization, bandwidth, and numerical aperture (NA). The overlay metrology system measures dozens or hundreds of sites on the sample, and the recipes are ranked based on the residuals of high order wafer and high order field model (e.g., W3F3 residuals). Although the BF-ARO scheme is simple and straightforward, it is time consuming to measure a large number of sampling recipes. Thus, not all the possible combinations may be covered in the BF-ARO scheme. In other words, recipes that yield the smallest residuals may be missing in the final ranking.

The MOAB-ARO scheme requires only five sampling sites at minimum, thus significantly shortening the evaluation time. Three important metrics, including kernel three-sigma (K3S), periodic ratio (PR), and contrast precision (CP) are combined to provide a single decision surface, the MOAB decision surface. Based on the MOAB decision surface, recipes that are not suitable for measurements can be screened out. However, the value of the MOAB decision surface is not strongly correlated with residuals. Thus, the recipes recommended in the MOAB-ARO scheme are not necessarily recipes with the smallest residuals.

For scatterometry-based overlay metrology subsystems, the BF-ARO scheme is also applicable, in addition to a resonance modeling (RM) ARO scheme. In the RM-ARO scheme, overlay values are calculated in the resonance regimes, in which overlay accuracy varies dramatically with wavelength. RM-ARO requires fewer sampling sites and therefore takes less measurement time. However, RM-ARO requires the existence of high-quality resonance regimes, which may be unavailable on some sample layers. Furthermore, with recent developments of a multi-wavelength approach towards overlay measurement in both imaging-based and scatterometry-based metrology subsystems, the possible recipes increase exponentially with an increase in the number of wavelengths, which is beyond the capability of the above mentioned ARO schemes.

To solve the challenge of a long evaluation time due to a large number of sampling sites and to directly establish a bridge between output quality metrics and residuals, an alternative ARO solution is desirable.

SUMMARY

An overlay metrology system is disclosed in accordance with one or more illustrative embodiments of the present disclosure. In one illustrative embodiment, the overlay metrology system comprises a controller configured to be communicatively coupled with an overlay metrology subsystem. In another illustrative embodiment, the controller includes one or more processors configured to execute program instructions causing the one or more processors to: receive one or more overlay measurements from the overlay metrology subsystem, generate one or more quality metrics using the one or more measurements, extract a set of principle components from the one or more quality metrics using principle component analysis (PCA), generate input data, wherein the input data comprises a subset of the set of principle components, and each principle component in the subset has a variance higher than a threshold variance, input the input data into an input matrix of a supervised machine learning algorithm to train a predictive model, identify, in an output vector of the predictive model, a recipe or hardware configuration for the overlay metrology system.

An overlay metrology system is disclosed in accordance with one or more illustrative embodiments of the present disclosure. In one illustrative embodiment, the overlay metrology system comprises an overlay metrology subsystem. In another illustrative embodiment, the overlay metrology system includes a controller configured to be communicatively coupled with the overlay metrology subsystem. In another illustrative embodiment, the controller includes one or more processors configured to execute program instructions causing the one or more processors to: receive one or more overlay measurements from the overlay metrology subsystem, generate one or more quality metrics using the one or more measurements, extract a set of principle components from the one or more quality metrics using principle component analysis (PCA), generate input data, wherein the input data comprises a subset of the set of principle components, and each principle component in the subset has a variance higher than a threshold variance, input the input data into an input matrix of a supervised machine learning algorithm to train a predictive model, identify, in an output vector of the predictive model, a recipe or hardware configuration with a minimum residual value, and provide one or more control instructions to adjust the overlay metrology subsystem to the recipe or hardware configuration with the minimum residual value.

A method of training a predictive model is disclosed in accordance with one or more illustrative embodiments of the present disclosure. In one illustrative embodiment, the method comprises receiving one or more overlay measurements from an overlay metrology subsystem. In another illustrative embodiment, the method comprises generating one or more quality metrics using the one or more measurements. In another illustrative embodiment, the method comprises extracting a set of principle components from the one or more quality metrics using principle component analysis (PCA). In another illustrative embodiment, the method comprises generating input data, wherein the input data comprises a subset of the set of principle components, and each principle component in the subset has a variance higher than a threshold variance. In another illustrative embodiment, the method comprises inputting the input data into an input matrix of a supervised machine learning algorithm to train the predictive model. In another illustrative embodiment, the method comprises identifying, in an output vector of the predictive model, a recipe or hardware configuration for the overlay metrology system.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF THE DRAWINGS

The numerous advantages of the disclosure may be better understood by those skilled in the art by reference to the accompanying figures in which:

FIGS. 3A-B show a flow diagram illustrating a cross-validation method for evaluating the performance of machine learning algorithms, in accordance with one or more embodiments of the present disclosure.

FIG. 4 is a table presenting the results of applying various machine learning algorithms to predict recipes, in accordance with one or more embodiments of the present disclosure.

DETAILED DESCRIPTION OF THE INVENTION

Figure 1A:
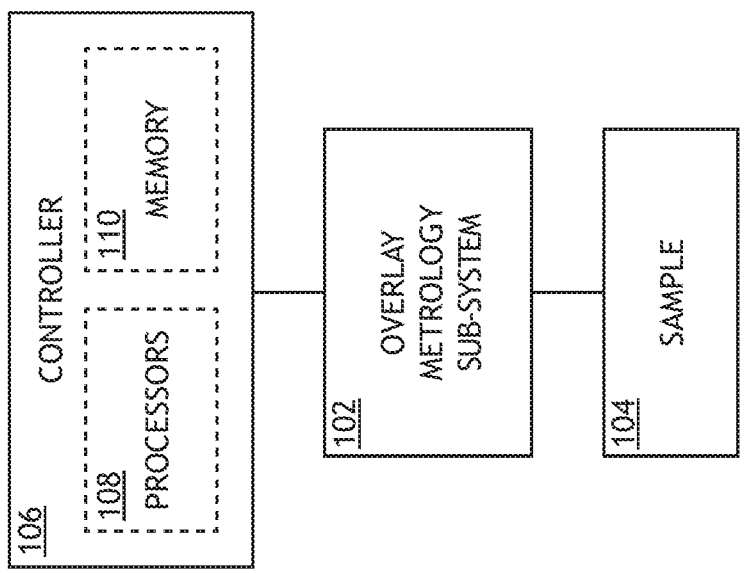
FIG. 1A is a simplified schematic view of an overlay metrology system, in accordance with one or more embodiments of the present disclosure.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention. Reference will now be made in detail to the subject matter disclosed, which is illustrated in the accompanying drawings.

The present disclosure is directed to an overlay metrology system that employs optical illumination having a tunable wavelength for overlay measurement. With such a continuous choice of possible wavelengths for overlay measurement, algorithms may be used to select the optimal wavelength (e.g., the optimal recipe or hardware configuration) for accurate and robust measurements. In particular, the present disclosure is directed to a machine learning algorithm that quickly and accurately identifies an optimal recipe for an overlay metrology subsystem.

A recipe may include a set of measurement parameters utilized to generate an overlay signal. For example, a recipe of an overlay metrology system may include, but is not limited to, an illumination wavelength, a detected wavelength of radiation emanating from the sample, a spot size of illumination on the sample, an angle of incident illumination, a polarization of incident illumination, a position of a beam of incident illumination on an overlay target, a position of an overlay target in the focal volume of the overlay metrology tool, or the like. Accordingly, an overlay recipe may include a set of measurement parameters for generating an overlay signal suitable for determining overlay of two or more sample layers.

The accuracy and/or the repeatability of an overlay measurement may depend on the overlay recipe as well as a wide range of factors associated with the particular geometry of the overlay target such as, but not limited to, thicknesses of sample layers, the sizes of overlay target features, the density or pitch of overlay target features, or the composition of sample layers. Further, the particular geometry of overlay targets may vary across the sample in both predictable and unpredictable manners. For example, the thicknesses of fabricated layers may vary across the sample in a known distribution (e.g., a thickness may be expected to be slightly larger in the center of a sample than along an edge) or may vary according to random fluctuations associated with defects or random variations of processing steps. Accordingly, a particular overlay recipe may not provide the same accuracy and/or repeatability when applied to all overlay targets of a sample, even if process variations are within selected fabrication tolerances.

An overlay measurement using a given algorithm is typically performed under an assumption that the overlay target includes perfectly symmetric features developed on perfectly uniform sample layers formed from perfectly uniform materials. However, process variations associated with fabrication of an overlay target may introduce deviations of a fabricated overlay target from designed characteristics (e.g., sidewall asymmetries, or the like). For example, process variations may include variations in the deposition of film layers, the exposure of patterns on film layers, etching the exposed patterns on the film layers, and the like. In this regard, any impact of deviations of a fabricated overlay target from designed characteristics on the measured signal may be improperly attributed to overlay error and may thus manifest as inaccuracies in the overlay measurement.

Further, it may be the case that, for a given overlay target and a given overlay algorithm, different metrology recipes (e.g., different hardware configurations of the overlay metrology subsystem) may exhibit different sensitivity to process errors. Put another way, it may be possible to identify particular measurement recipes (e.g., particular values of wavelength, polarization, or the like used by an overlay metrology subsystem to characterize an overlay target) that are relatively robust to process variations associated with fabrication of a particular overlay target. In this regard, robust and accurate overlay measurements may be achieved.

For the purposes of the present disclosure, an overlay signal associated with an overlay metrology subsystem may be considered to be an output of the overlay metrology subsystem having sufficient information to determine an overlay including relative positions of overlay target features on two or more sample layers (e.g., through analysis using one or more processors, or the like). For example, an overlay signal may include, but is not required to include, one or more datasets, one or more images, one or more detector readings, or the like.

As used throughout the present disclosure, the term "sample" generally refers to a substrate formed of a semiconductor or non-semiconductor material (e.g., a wafer, or the like). For example, a semiconductor or non-semiconductor material may include, but is not limited to, monocrystalline silicon, gallium arsenide, and indium phosphide. A sample may include one or more layers. For example, such layers may include, but are not limited to, a resist, a dielectric material, a conductive material, and a semiconductive material. Many different types of such layers are known in the art, and the term sample as used herein is intended to encompass a sample on which all types of such layers may be formed. One or more layers formed on a sample may be patterned or unpatterned. For example, a sample may include a plurality of dies, each having repeatable patterned features. Formation and processing of such layers of material may ultimately result in completed devices. Many different types of devices may be formed on a sample, and the term sample as used herein is intended to encompass a sample on which any type of device known in the art is being fabricated. Further, for the purposes of the present disclosure, the term sample and wafer should be interpreted as interchangeable. In addition, for the purposes of the present disclosure, the terms patterning device, mask and reticle should be interpreted as interchangeable.

FIG. 1A is a conceptual view illustrating an overlay metrology system 100, in accordance with one or more embodiments of the present disclosure.

In one embodiment, the overlay metrology system 100 includes an overlay metrology subsystem 102 configured to acquire overlay signals from overlay targets based on any number of overlay recipes. For example, the overlay metrology subsystem 102 may direct illumination to a sample 104 and may further collect radiation emanating from the sample 104 to generate an overlay signal suitable for the determination of overlay of two or more sample layers. The overlay metrology subsystem 102 may be any type of overlay metrology tool or device known in the art suitable for generating overlay signals suitable for determining overlay associated with overlay targets on a sample 104. The overlay metrology subsystem 102 may operate in an imaging mode or a non-imaging mode. For example, in an imaging mode, individual overlay target elements may be resolvable within the illuminated spot on the sample (e.g., as part of a bright-field image, a dark-field image, a phase-contrast image, or the like). By way of another example, the overlay metrology subsystem 102 may operate as a scatterometry-based overlay metrology tool in which radiation from the sample is analyzed at a pupil plane to characterize the angular distribution of radiation from the sample 104 (e.g., associated with scattering and/or diffraction of radiation by the sample 104).

Further, the overlay subsystem 102 may be configurable to generate overlay signals based on any number of recipes defining measurement parameters for the acquiring an overlay signal suitable for determining overlay of an overlay target. For example, a recipe of an overlay metrology tool may include, but is not limited to, an illumination wavelength, a detected wavelength of radiation emanating from the sample, a spot size of illumination on the sample, an angle of incident illumination, a polarization of incident illumination, a position of a beam of incident illumination on an overlay target, a position of an overlay target in the focal volume of the overlay metrology subsystem 102, or the like.

In another embodiment, the overlay metrology system 100 includes a controller 106 communicatively coupled to the overlay metrology subsystem 102. The controller 106 may be configured to direct the overlay metrology subsystem 102 to generate overlay signals based on one or more selected recipes. The controller 106 may be further configured to receive data including, but not limited to, overlay signals from the overlay metrology subsystem 102. Additionally, the controller 106 may be configured to determine overlay associated with an overlay target based on the acquired overlay signals. The controller 106 may be, for example, a workstation, a terminal, a personal computer, a laptop, a tablet, a mobile device, etc.

In another embodiment, the controller 106 includes one or more processors 108. The one or more processors 108 may be configured to execute a set of program instructions maintained in a memory device 110, or memory. The one or more processors 108 of a controller 106 may include any processing element known in the art. In this sense, the one or more processors 108 may include any microprocessor-type device configured to execute algorithms and/or instructions (e.g., a central processing unit [CPU] and/or a graphics processing unit [GPU]). Further, the memory device 110 may include any storage medium known in the art suitable for storing program instructions executable by the associated one or more processors 108. For example, the memory device 110 may include a non-transitory memory medium. As an additional example, the memory device 110 may include, but is not limited to, a read-only memory, a random access memory, a magnetic or optical memory device, a hard disk drive (HDD), a magnetic tape, flash memory, a solid state drive (SSD), and the like. It is further noted that memory device 110 may be housed in a common controller housing with the one or more processors 108.

Figure 1B:
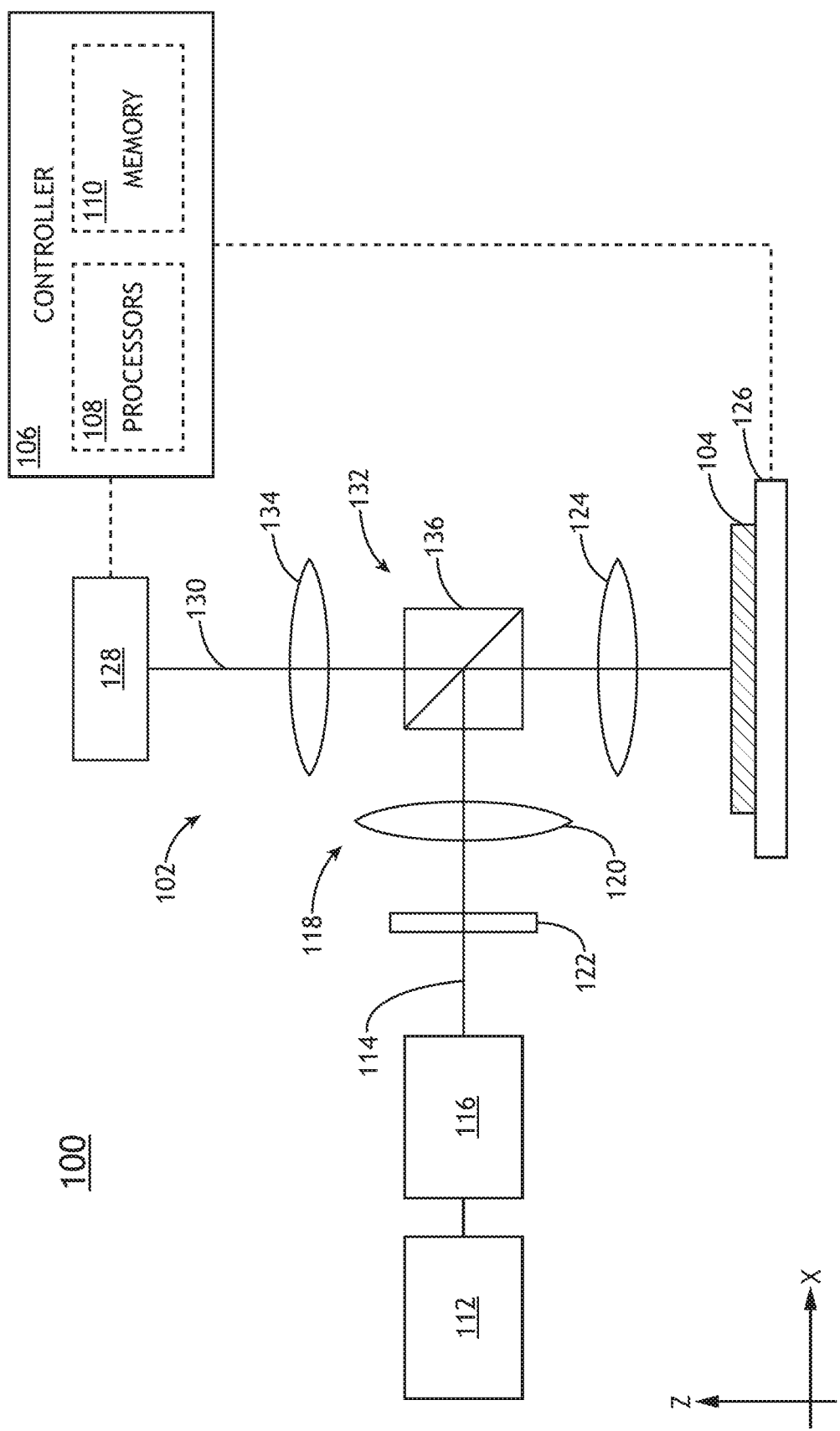
FIG. 1B is a simplified schematic view of an overlay metrology subsystem, in accordance with one or more embodiments of the present disclosure.

FIG. 1B is a conceptual view illustrating the overlay metrology subsystem 102, in accordance with one or more embodiments of the present disclosure. In one embodiment, the overlay metrology subsystem 102 includes an illumination source 112 configured to generate an illumination beam 114. The illumination beam 114 may include one or more selected wavelengths of light including, but not limited to, ultraviolet (UV) radiation, visible radiation, or infrared (IR) radiation.

The illumination source 112 may include any type of illumination source suitable for providing an illumination beam 114. In one embodiment, the illumination source 112 is a laser source. For example, the illumination source 112 may include, but is not limited to, one or more narrowband laser sources, a broadband laser source, a supercontinuum laser source, a white light laser source, or the like. In this regard, the illumination source 112 may provide an illumination beam 114 having high coherence (e.g., high spatial coherence and/or temporal coherence). In another embodiment, the illumination source 112 includes a laser-sustained plasma (LSP) source. For example, the illumination source 112 may include, but is not limited to, a LSP lamp, a LSP bulb, or a LSP chamber suitable for containing one or more elements that, when excited by a laser source into a plasma state, may emit broadband illumination. In another embodiment, the illumination source 112 may include a lamp source. For example, the illumination source 112 may include, but is not limited to, an arc lamp, a discharge lamp, an electrode-less lamp, or the like. In this regard, the illumination source 112 may provide an illumination beam 114 having low coherence (e.g., low spatial coherence and/or temporal coherence). In another embodiment, the illumination source 112 may include a synchrotron source.

In another embodiment, the overlay metrology system 100 includes a wavelength selection device 116 to control the spectrum of the illumination beam 114 for illumination of the sample 104. For example, the wavelength selection device 116 may include a tunable filter suitable for providing an illumination beam 114 with a selected spectrum (e.g., center wavelength, bandwidth, spectral profile, or the like). By way of another example, the wavelength selection device 116 may adjust one or more control settings of a tunable illumination source 112 to directly control the spectrum of the illumination beam 114. Further, the controller 106 may be communicatively coupled to the illumination source 112 and/or the wavelength selection device 116 to adjust one or more aspects of the spectrum of the illumination beam 114.

In another embodiment, the overlay metrology subsystem 102 directs the illumination beam 114 to the sample 104 via an illumination pathway 118. The illumination pathway 118 may include one or more optical components suitable for modifying and/or conditioning the illumination beam 114 as well as directing the illumination beam 114 to the sample 104. For example, the illumination pathway 118 may include, but is not required to include, one or more lenses 120 (e.g., to collimate the illumination beam 114, to relay pupil and/or field planes, or the like), one or more polarizers 122 to adjust the polarization of the illumination beam 114, one or more filters, one or more beam splitters, one or more diffusers, one or more homogenizers, one or more apodizers, one or more beam shapers, or one or more mirrors (e.g., static mirrors, translatable mirrors, scanning mirrors, or the like). In another embodiment, the overlay metrology subsystem 102 includes an objective lens 124 to focus the illumination beam 114 onto the sample 104 (e.g., an overlay target with overlay target elements located on two or more layers of the sample 104). In another embodiment, the sample 104 is disposed on a sample stage 126 suitable for securing the sample 104 and further configured to position the sample 104 with respect to the illumination beam 114.

In another embodiment, the overlay metrology subsystem 102 includes one or more detectors 128 configured to capture radiation (e.g., sample radiation 130) emanating from the sample 104 (e.g., an overlay target on the sample 104) through a collection pathway 132 and generate one or more overlay signals indicative of overlay of two or more layers of the sample 104. The collection pathway 132 may include multiple optical elements to direct and/or modify illumination collected by the objective lens 124 including, but not limited to one or more lenses 134, one or more filters, one or more polarizers, one or more beam blocks, or one or more beamsplitters. For example, a detector 128 may receive an image of the sample 104 provided by elements in the collection pathway 132 (e.g., the objective lens 124, the one or more lenses 134, or the like). By way of another example, a detector 128 may receive radiation reflected or scattered (e.g., via specular reflection, diffuse reflection, and the like) from the sample 104. By way of another example, a detector 128 may receive radiation generated by the sample (e.g., luminescence associated with absorption of the illumination beam 114, and the like). By way of another example, a detector 128 may receive one or more diffracted orders of radiation from the sample 104 (e.g., 0-order diffraction, ±1 order diffraction, ±2 order diffraction, and the like).

The illumination pathway 118 and the collection pathway 132 of the overlay metrology subsystem 102 may be oriented in a wide range of configurations suitable for illuminating the sample 104 with the illumination beam 114 and collecting radiation emanating from the sample 104 in response to the incident illumination beam 114. For example, as illustrated in FIG. 1B, the overlay metrology subsystem 102 may include a beamsplitter 136 oriented such that the objective lens 124 may simultaneously direct the illumination beam 114 to the sample 104 and collect radiation emanating from the sample 104. By way of another example, the illumination pathway 118 and the collection pathway 132 may contain non-overlapping optical paths.

Figure 1C:
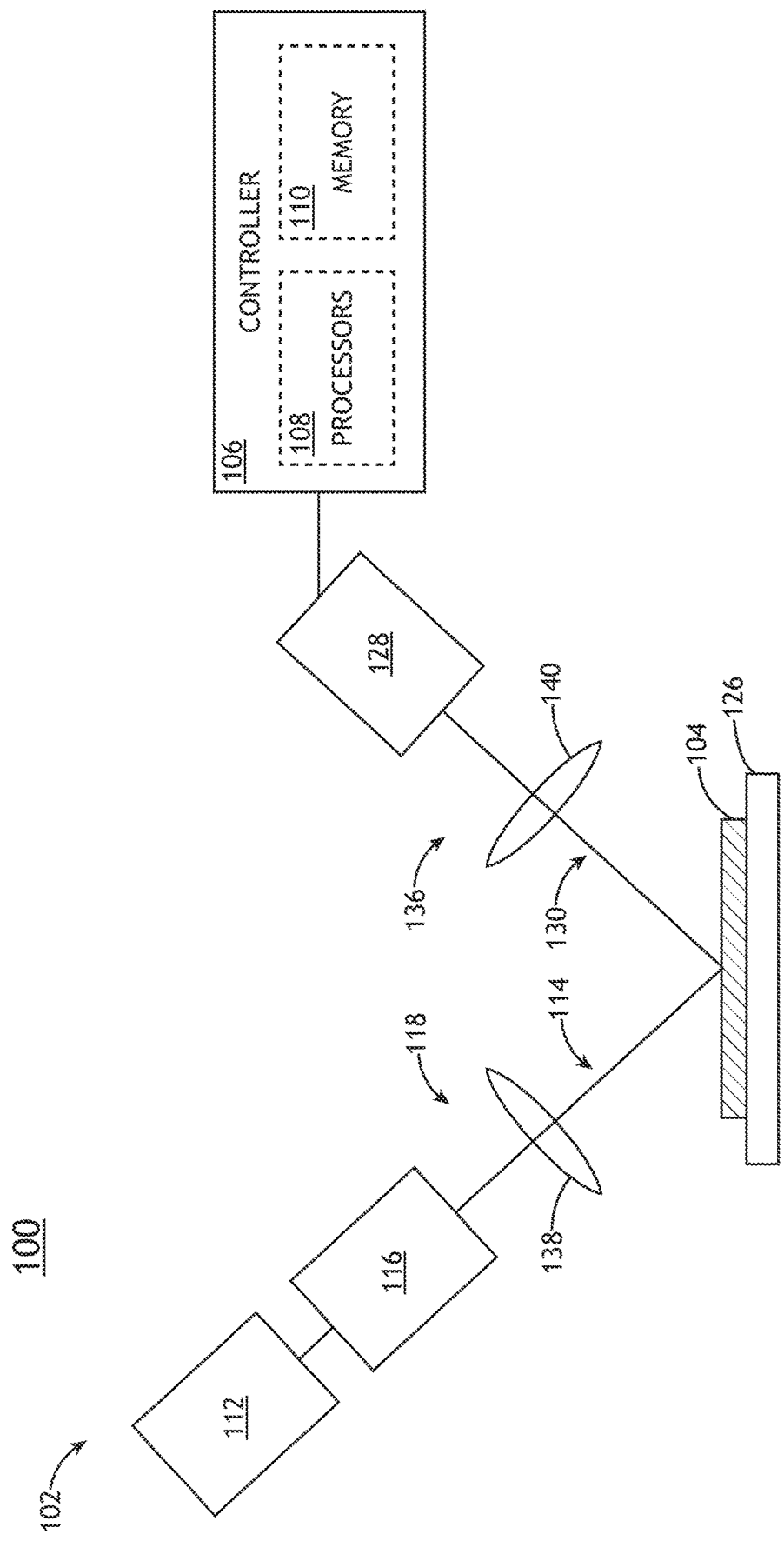
FIG. 1C is a schematic view of an overlay metrology subsystem, in accordance with one or more embodiments of the present disclosure.

FIG. 1C is a conceptual view illustrating an overlay metrology subsystem 102, in accordance with one or more embodiments of the present disclosure. In one embodiment, the illumination pathway 118 and the collection pathway 132 contain separate elements. For example, the illumination pathway 118 may utilize a first focusing element 138 to focus the illumination beam 114 onto the sample 104 and the collection pathway 132 may utilize a second focusing element 140 to collect radiation from the sample 104. In this regard, the numerical apertures of the first focusing element 138 and the second focusing element 140 may be different. In another embodiment, one or more optical components may be mounted to a rotatable arm (not shown) pivoting around the sample 104 such that the angle of incidence of the illumination beam 114 on the sample 104 may be controlled by the position of the rotatable arm.

As described previously herein, the overlay metrology subsystem 102 may be configured to generate overlay signals associated with overlay targets on the sample 104 using any number of overlay recipes (e.g., sets of measurement parameters). Further, the overlay metrology subsystem 102 may provide rapid tuning of the measurement parameters such that multiple overlay signals based on different recipes may be rapidly acquired. For example, the controller 106 of the overlay metrology system 100 may be communicatively coupled with one or more adjustable components of the overlay metrology subsystem 102 to configure the adjustable components in accordance with an overlay recipe.

An overlay recipe may include one or more aspects of the spectrum of the illumination beam 114 incident on the sample such as, but not limited to the wavelength (e.g., the central wavelength), the bandwidth, and the spectral profile of the illumination beam 114 as measurement parameters. For example, the controller 106 may be communicatively coupled to the illumination source 112 and/or the wavelength selection device 116 to adjust the spectrum of the illumination beam 114 in accordance with an overlay recipe.

In one embodiment, the wavelength selection device 116 includes one or more position-tunable spectral filters in which spectral characteristics of an incident illumination beam 114 (e.g., a center wavelength, a bandwidth, a spectral transmissivity value or the like) may be rapidly tuned by modifying the position of the illumination beam 114 on the filter. Further, position-tunable spectral filters may include any type of spectral filter such as, but not limited to, a low-pass filter, a high-pass filter, a band-pass filter, or a band-reject filter.

For example, a position-tunable spectral filter may include one or more thin films operating as an edge filter with a position-tunable cutoff wavelength. In this regard, the cutoff wavelength may be tuned by modifying the position of the illumination beam 114 on the filter. For instance, a low-pass edge filter may pass (e.g., via transmission or reflection) wavelengths below the cutoff wavelength, whereas a high-pass edge filter may pass wavelengths above the cutoff wavelength. Further, a band-pass filter may be formed from a low-pass edge filter combined with a high-pass edge filter.

Referring now to FIGS. 2 through 5, a machine learning algorithm employed to automatically optimize an overlay recipe (e.g., automatic recipe optimization [ARO]) is described in greater detail. In particular, an optimal measurement wavelength may be selected for maximizing measurement accuracy and repeatability.

Figure 2:
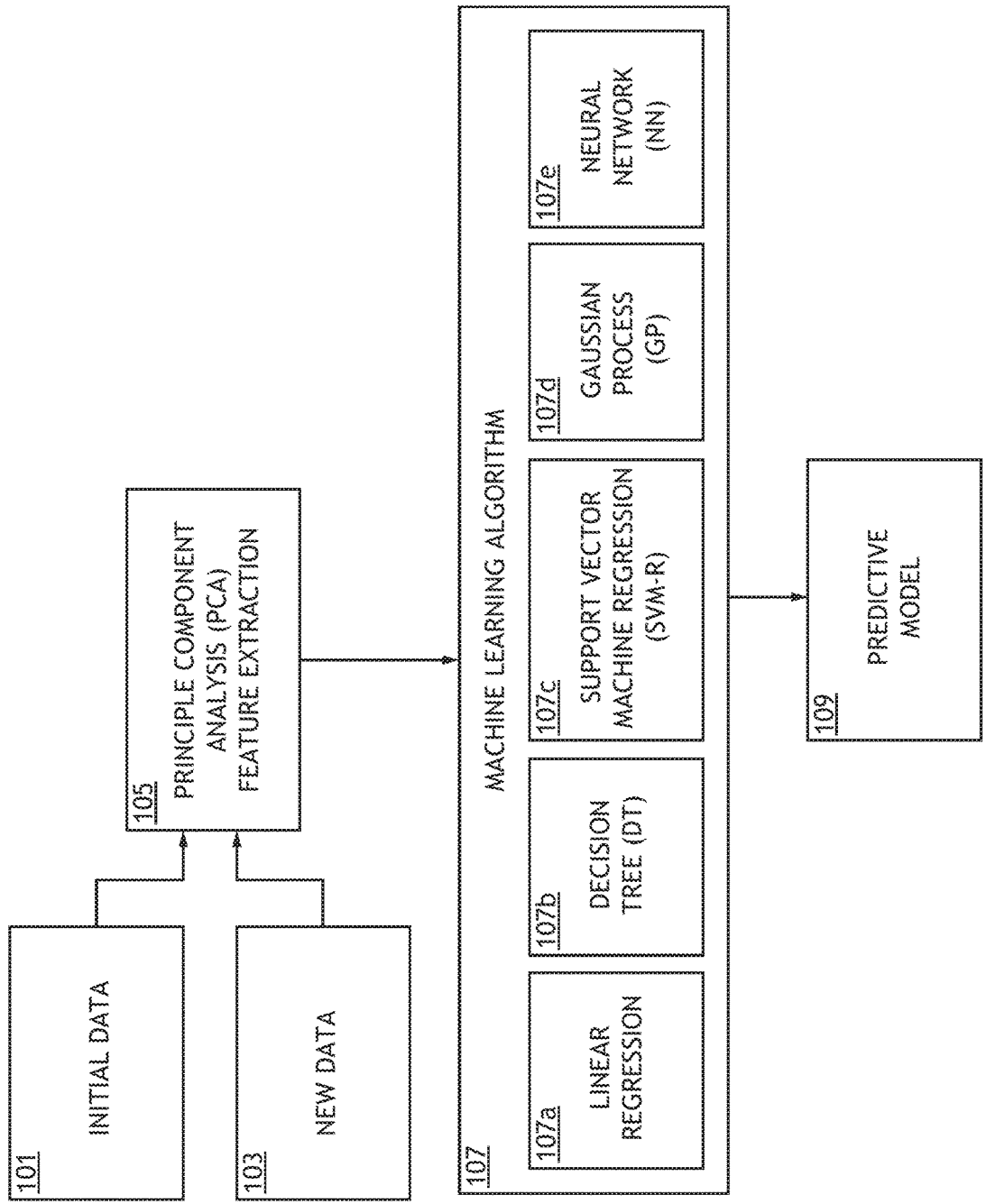
FIG. 2 is a simplified flow diagram of machine learning-based automatic recipe optimization (ARO), in accordance with one or more embodiments of the present disclosure.

FIG. 2 is a simplified flow diagram of ML-based ARO. The input data (e.g., initial data 101 and new data 103) may comprise quality metrics generated by the overlay metrology subsystem 102. The controller 106 may be configured to be communicatively coupled with the overlay metrology subsystem 102. The memory 110 of the controller 106 may store program instructions comprising the ML-based ARO including a feature extraction algorithm 105, a ML algorithm 107, and a predictive model 109. The one or more processors 108 of the controller 106 may execute program instructions causing the one or more processors to perform the ML-based ARO and adjust the recipe of the overlay metrology subsystem 102 accordingly.

Instead of generating quality metrics associated with each sampling site on the sample (e.g., sample 104), the sample mean and sample three-sigma may first be calculated. This calculation makes the number of sampling sites irrelevant, and enables the possibility of using a small number of sampling sites in the future. The feature extraction algorithm 105 may be a principle component analysis (PCA) algorithm. PCA may be used to filter useful information that can directly influence residuals. PCA converts all quality metrics, which may be correlated, into a set of values of linearly uncorrelated variables called principal components. In one embodiment, there are 167 quality metrics. In other embodiments, there are more or less than 167 quality metrics. The variance of each component (given by the corresponding eigenvalue) gives a rough estimate as to how significant the component is in the system. In order to minimize computational cost, only the components with the highest variance (e.g., above a threshold variance) may be input into the supervised machine learning algorithm 107.

The input variables (i.e., the quality metrics after PCA) of the supervised machine learning algorithm 107 may form an input matrix $X_{train}$. Each column of $X_{train}$ may correspond to one input index (e.g., a type of quality metric) and each row of $X_{train}$ may correspond to one recipe (e.g., a hardware configuration; for example, a wavelength). The output vector $Y_{train}$ may form the residuals of each recipe (e.g., W3F3 residuals). Other accuracy indicators such as precision and tool induced shifts (TIS) may also be included. Different algorithms may be used in the supervised machine learning algorithm 107 to teach the computer to learn the mapping function from the input to the output ($Y_{train}=f[X_{train}]$). The supervised machine learning algorithm 107 may comprise a linear regression algorithm 107a, a decision tree (DT) algorithm 107b, a support vector machine regression (SVM-R) algorithm 107c, a Gaussian process (GP) algorithm 107d, and/or a neural network (NN) algorithm 107e. By training the predictive model 109, a fixed set of weightings and biases may define the mapping function $f(X_{train})$. Once new measurement results are obtained (e.g., the new input data 103), residuals may be calculated by following the same data-extraction procedure as the model 109 is trained. The recipe with the lowest residual value (e.g., minimum residual value) may be identified, and the metrology subsystem 102 may then be adjusted accordingly (e.g., tuned to a specific wavelength providing the most accurate overlay measurement). Two important advantages of the ML-ARO scheme related to the number of sampling sites and the combination of models are now described in greater detail.

When the predictive model 109 is trained, the wafer mean and the wafer three-sigma of each quality metric and residual (e.g., W3F3 residual) are calculated based on a large number of sampling sites (200 sites or 300 sites). This large number provides more accurate residual values, and thus ensures that the trained mapping function can reflect the true relationship between the inputs (e.g., the initial input data 101) and the outputs (e.g., the predictive model 109). However, a small number of sampling sites (e.g., 5-10 sites) may be used for the collection of new data (e.g., the new input data 103) since the new data is representative enough for predicting the condition of the layer that is under evaluation. Such a significant drop in sampling size reduces the time necessary to dedicate the metrology subsystem 102 to ARO (e.g., by 10-20 times compared to a conventional ARO scheme). Thus, time saving is a large advantage of machine learning based ARO.

For each given training data set, multiple predictive models 109 may be trained at the same time using the algorithms 107a-e described with respect to FIG. 2. The results of each predictive model 109 may be averaged, either linearly or nonlinearly, to yield final prediction results (i.e., W3F3 residuals). Each of the algorithms 107a-e has particular advantages and disadvantages. For example, the decision tree algorithm 107b may be easy to interpret and implement, but may be unable to model a system with high complexity and thus may suffer from underfitting. The neural network algorithm 107e, on the other hand, may manage any complex system with at most two hidden layers, but is often vulnerable to overfitting. Both underfitting and overfitting worsen the generalization of the predictive model 109 and therefore reduce the performance of the predictive model 109. The combination of various learning algorithms (e.g., the algorithms 107a-e) may advantageously solve these issues by reducing the contribution of variance to the squared error.

In one example where the ML-ARO scheme is applied to an imaging-based overlay metrology subsystem 102, measurement data is collected on 16 different demo wafers with a large enough sampling size. The measurement data is then used to train and validate different machine learning models 109. Although not explicitly mentioned herein, a scatterometry-based ARO and a multi-wavelength recipe selection may follow a similar machine learning based procedure.

Figure 3A:
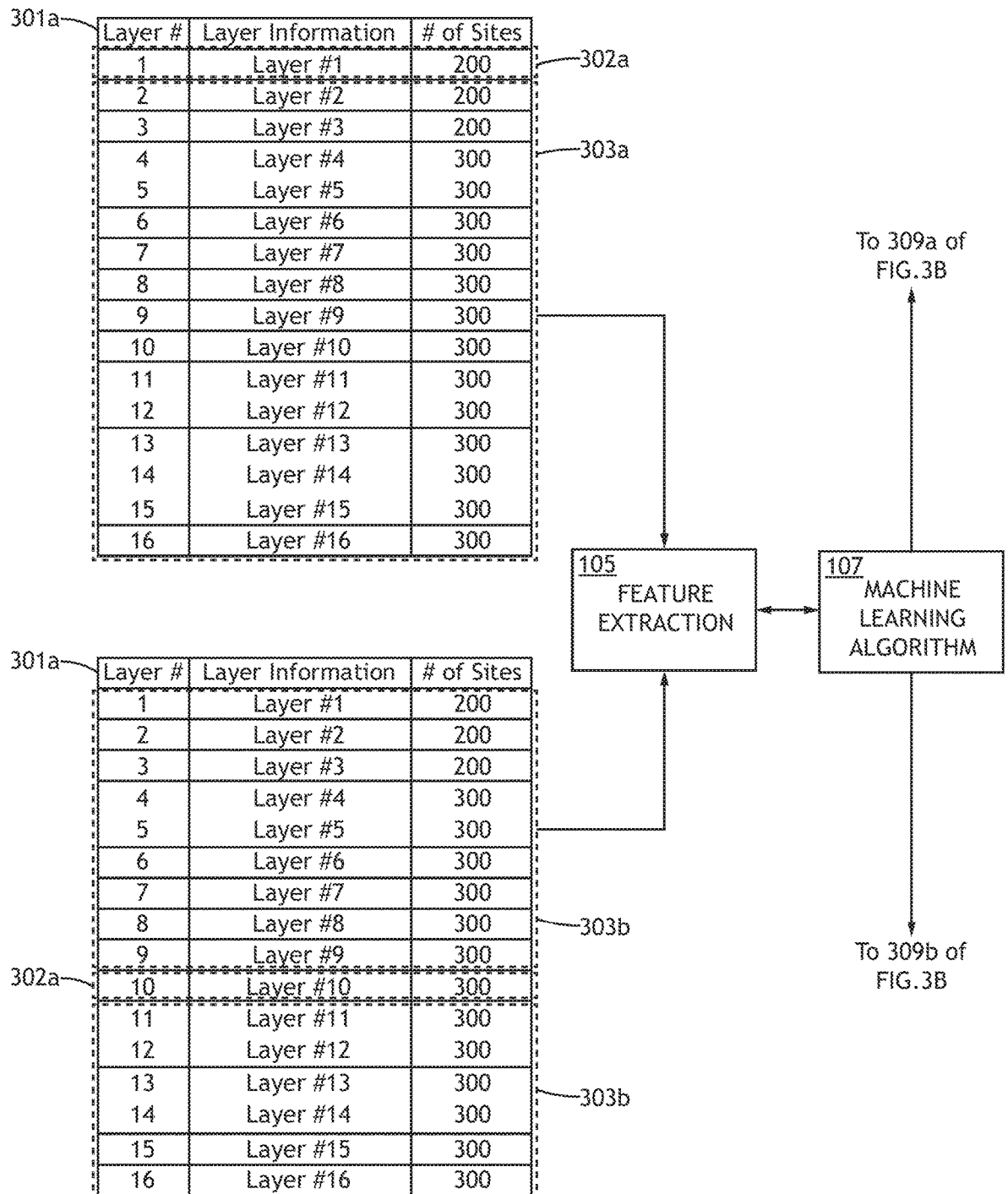

FIGS. 3A-B show a flow diagram illustrating a cross-validation method for evaluating the performance of each machine learning algorithm 107 after feature extraction 105 of the input data 301a-b. The feature extraction algorithm 105 and the machine learning algorithm 107 may be substantially similar to the similarly named components as described with respect to FIG. 2. In this method, one layer is picked, in sequence, as a test data set (layer 303a for input data 301a, and layer 303b for input data 301b) while the other layers are used as training data sets (layers 302a for input data 301a and layers 302b for input data 301b) for training predictive models using the machine learning algorithm 107. The quality metrics of the test data sets 303a-b are fed into the machine learning algorithm 107 to yield predicted residuals of each recipe. Plotting the predicted residuals (e.g., W3F3 residuals) and the residuals calculated from measured overlay in the line graphs 309a-b provides a qualitative understanding of the accuracy of the prediction. The horseshoe-shaped cycles are defined as the correctly predicted recipes, and they are the recipes appear in the top ten most accurate recipes for a given layer in both BF-ARO, in which recipes are ranked based on measured residuals, and ML-ARO, in which recipes are ranked based on predicted residuals.

The number of horseshoe-shaped cycles (i.e., correctly predicted recipes), are listed in in the table 401 of FIG. 4 for each of the layers 1 to 16 of the demo wafers (the input data 301a-b) and each machine learning algorithm 107a-e. Also shown in FIG. 4 are the results of combining some of the machine learning algorithms 107a-e with each other. A boosting tree, also known as gradient boosting, is a machine learning technique that produces a prediction model in the form of an ensemble of weak decision tree models into a single strong learner. The averaging method calculates the average of prediction results obtained from all machine learning algorithms 107a-e (e.g., a linear combination of learners). Since the results of the machine learning algorithm 107b (decision tree) and the machine learning algorithm 107e (neural network) are complementary to each other (e.g., NN performs better on layers #1, #2, #6, #7, and #11 and DT performs better on layers #5, #9, #15), the DT algorithm 107b and the NN algorithm 107e may be combined with a weighting of 0.9 for the NN algorithm 107e and 0.1 for the DT algorithm 107b to respectively yield advantageous machine performance in a strict-criteria case. Other methods of combining the algorithms 107a-e may also be pursued.

For quantitatively evaluating the performance of the algorithms 107a-e and systematically performing parameter fine tuning, two different key performance indicators (KPIs) may be defined. One KPI is the percentage of recipes that are correctly predicted, which may be defined as the total number of correctly predicted recipes divided by the number of the top ten most accurate recipes. Although such a KPI is straightforward and easy to understand, it is unable to differentiate the various algorithms 107a-e since the variation in its value is very small (0.32 to 0.40) for each algorithm 107a-e. To solve this problem, a second KPI, average-by-layer success rate, may be defined. For each of the top ten recipes, not all of them need to be correctly predicted due to their close residual performance. In this case, it may be assumed that three recipes are enough (criteria=3). If three or more correct recipes are predicted, the success rate is 1.00. If two correct recipes are predicted, the success rate is 0.66. If one correct recipe is predicted, the success rate is 0.33. If zero correct recipes are predicted, the success rate is 0. Averaging the success rate among all sixteen layers yields the average-by-layer success rate for criteria=3, which is shown in the table 401 of FIG. 4. For comparison, the results of stricter criteria (five recipes out of the top ten recipes) are shown in the same table 401. For data collected from demo wafers, it is clearly shown that the decision tree (DT) algorithm 107b and the neural network (NN) algorithm 107e yield the highest average-by-layer success rate in both the criteria=3 case and the criteria=5 case. Future parameter fine tuning may be performed with the aim of improving average by layer success rate.

Figure 5:
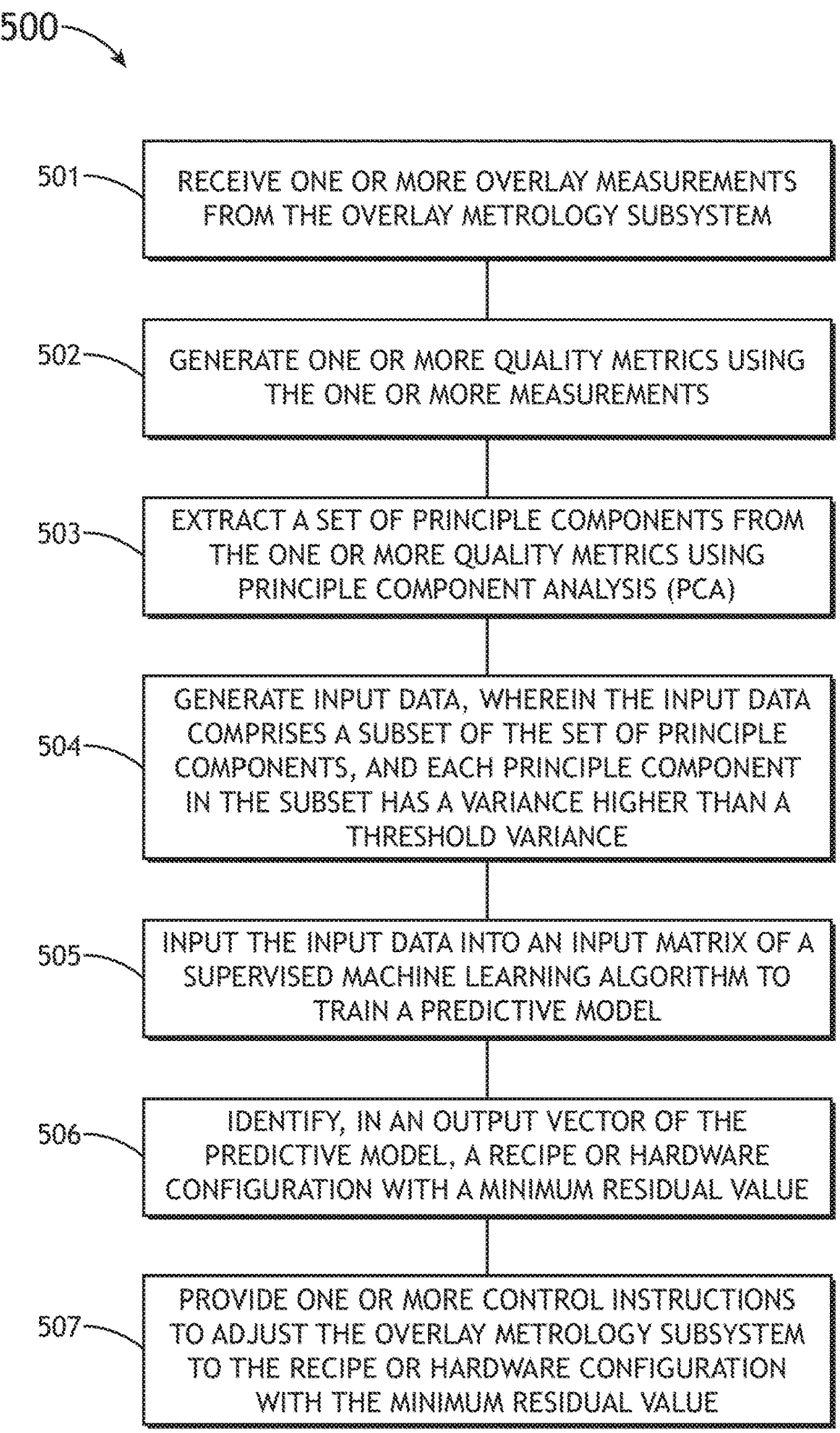
FIG. 5 is a flowchart illustrating a method of training a predictive model and adjusting an overlay metrology subsystem based on the predictive model, in accordance with one or more embodiments of the present disclosure.

FIG. 5 is a flowchart 500 illustrating a method of training a predictive model and adjusting an overlay metrology subsystem based on the predictive model.

At step 501, one or more overlay measurements from an overlay metrology subsystem (e.g., overlay metrology subsystem 102) may be received. Two or more layers of a sample (e.g., sample 104) may be measured, and the overlay measurement may be transmitted to a controller (e.g., controller 106).

At step 502, one or more quality metrics may be generated using the one or more measurements. The one or more quality metrics may be, for example, kernel three-sigma (K3S), periodic ratio (PR), and contrast precision (CP).

At step 503, a set of principle components may be extracted from the one or more quality metrics using principle component analysis (PCA). PCA may be used to filter useful information that can directly influence residual values. PCA converts all quality metrics, which may be correlated, into a set of values of linearly uncorrelated variables called principal components.

At step 504, input data (e.g., the input data 101 and 103) is generated. The input data may comprise a subset of the set of principle components. The variance of each component (given by the corresponding eigenvalue) gives a rough estimate as to how significant the component is in the system. Each principle component in the subset has a variance higher than a threshold variance.

At step 505, the input data is input into an input matrix (e.g., matrix $X_{train}$) of a supervised machine learning algorithm to train a predictive model (e.g., output vector $Y_{train}$). Each column of $X_{train}$ may correspond to one input index (e.g., a type of quality metric) and each row of $X_{train}$ may correspond to one recipe (e.g., a hardware configuration; for example, a wavelength). The output vector $Y_{train}$ may form the residuals of each recipe (e.g., W3F3 residuals). Other accuracy indicators such as precision and tool induced shifts (TIS) may also be included. Different algorithms may be used in the supervised machine learning algorithm 107 to teach the computer to learn the mapping function from the input to the output ($Y_{train}=f[X_{train}]$). The supervised machine learning algorithm 107 may comprise a linear regression algorithm 107a, a decision tree (DT) algorithm 107b, a support vector machine regression (SVM-R) algorithm 107c, a Gaussian process (GP) algorithm 107d, and/or a neural network (NN) algorithm 107e. By training the predictive model 109, a fixed set of weightings and biases may define the mapping function f(Xtrain). Once new measurement results are obtained (e.g., the new input data 103), residuals may be calculated by following the same data-extraction procedure as the model 109 is trained.

At step 506, a recipe or hardware configuration with a minimum residual value is identified in an output vector of the predictive model.

At step 507, one or more control instructions may be provided (e.g., by the controller 106) to adjust the overlay metrology subsystem (e.g., subsystem 102) to the recipe or hardware configuration with the minimum residual value (e.g., tuned to a specific wavelength providing the most accurate overlay measurement for the given sample).

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. An overlay metrology system, comprising:
a controller configured to be communicatively coupled with an overlay metrology subsystem, the controller including one or more processors configured to execute program instructions causing the one or more processors to:
receive one or more overlay measurements from the overlay metrology subsystem;
generate one or more quality metrics using the one or more measurements;
extract a set of principle components from the one or more quality metrics using principle component analysis (PCA);
generate input data, wherein the input data comprises a subset of the set of principle components, and each principle component in the subset has a variance higher than a threshold variance;
input the input data into an input matrix of a supervised machine learning algorithm to train a predictive model; and
identify, in an output vector of the predictive model, at least one of a recipe or hardware configuration for the overlay metrology subsystem.

2. The overlay metrology system of claim 1, wherein the at least one of the recipe or the hardware configuration for the overlay metrology system correlates to a minimum residual value.

3. The overlay metrology system of claim 2, wherein the controller including the one or more processors is further configured to execute program instruction causing the one or more processors to provide one or more control instructions to adjust the overlay metrology subsystem to at least one of the recipe or the hardware configuration that correlates to the minimum residual value.

4. The overlay metrology system of claim 1, wherein the output vector of the predictive model comprises an average of a plurality of output vectors of multiple predictive models.

5. The overlay metrology system of claim 1, wherein the input matrix comprises columns and rows, each of the columns represents a type of quality metric, and each of the rows represents the recipe or hardware configuration for the overlay metrology subsystem.

6. The overlay metrology system of claim 1, wherein the output vector comprises rows, and each of the rows represents a residual value.

7. The overlay metrology system of claim 1, wherein the supervised machine learning algorithm comprises linear regression.

8. The overlay metrology system of claim 1, wherein the supervised machine learning algorithm comprises a decision tree (DT).

9. The overlay metrology system of claim 1, wherein the supervised machine learning algorithm comprises support vector machine regression (SVM-R).

10. The overlay metrology system of claim 1, wherein the supervised machine learning algorithm comprises a Gaussian process (GP).

11. The overlay metrology system of claim 1, wherein the supervised machine learning algorithm comprises a neural network (NN).

12. An overlay metrology system, comprising:
an overlay metrology subsystem; and
a controller configured to be communicatively coupled with the overlay metrology subsystem, the controller including one or more processors configured to execute program instructions causing the one or more processors to:
receive one or more overlay measurements from the overlay metrology subsystem;
generate one or more quality metrics using the one or more measurements;
extract a set of principle components from the one or more quality metrics using principle component analysis (PCA);
generate input data, wherein the input data comprises a subset of the set of principle components, and each principle component in the subset has a variance higher than a threshold variance;
input the input data into an input matrix of a supervised machine learning algorithm to train a predictive model; and
identify, in an output vector of the predictive model, at least one of a recipe or hardware configuration for the overlay metrology system.

13. The overlay metrology system of claim 12, wherein the at least one of the recipe or the hardware configuration for the overlay metrology system correlates to a minimum residual value.

14. The overlay metrology system of claim 13, wherein the controller including the one or more processors is further configured to execute program instruction causing the one or more processors to provide one or more control instructions to adjust the overlay metrology subsystem to at least one of the recipe or the hardware configuration that correlates to the minimum residual value.

15. The overlay metrology system of claim 12, wherein the overlay metrology subsystem comprises an imaging-based or a scatterometry-based overlay metrology subsystem.

16. A method of training a predictive model, comprising:
receiving one or more overlay measurements from an overlay metrology subsystem;
generating one or more quality metrics using the one or more measurements;
extracting a set of principle components from the one or more quality metrics using principle component analysis (PCA);
generating input data, wherein the input data comprises a subset of the set of principle components, and each principle component in the subset has a variance higher than a threshold variance;
inputting the input data into an input matrix of a supervised machine learning algorithm to train the predictive model; and
identifying, in an output vector of the predictive model, at least one of a recipe or hardware configuration for the overlay metrology subsystem.

17. The method of claim 16, wherein the at least one of the recipe or the hardware configuration for the overlay metrology subsystem correlates to a minimum residual value.

18. The method of claim 17, further comprising providing one or more control instructions to adjust the overlay metrology subsystem to at least one of the recipe or the hardware configuration that correlates to the minimum residual value.

19. The method of claim 16, wherein the overlay metrology subsystem comprises an imaging-based or a scatterometry-based overlay metrology subsystem.

20. The method of claim 16, wherein the output vector of the predictive model comprises an average of a plurality of output vectors of multiple predictive models.

21. The method of claim 16, wherein the input matrix comprises columns and rows, each of the columns represents a type of quality metric, and each of the rows represents the recipe or hardware configuration for the overlay metrology subsystem.

22. The method of claim 16, wherein the output vector comprises rows, and each of the rows represents a residual value.

23. The method of claim 16, wherein the supervised machine learning algorithm comprises linear regression.

24. The method of claim 16, wherein the supervised machine learning algorithm comprises a decision tree (DT).

25. The method of claim 16, wherein the supervised machine learning algorithm comprises support vector machine regression (SVM-R).

26. The method of claim 16, wherein the supervised machine learning algorithm comprises a Gaussian process (GP).

27. The method of claim 16, wherein the supervised machine learning algorithm comprises a neural network (NN).

* * * * *